April 5, 1966 J. J. LENTZ 3,245,020

SUPERCONDUCTIVE GATING DEVICES AND CIRCUITS HAVING TWO SUPERCONDUCTIVE SHIELD PLANES

Filed Nov. 29, 1962 3 Sheets-Sheet 1

INVENTOR.
JOHN J. LENTZ

BY Curtis Ailes Jr.

ATTORNEY 3,245,020

SUPERCONDUCTIVE GATING DEVICES AND CIRCUITS HAVING TWO SUPERCONDUCTIVE SHIELD PLANES

John J. Lentz, Columbus, Ohio, assignor to International Business Machines Corporation, New York, N.Y., a corporation of New York Filed Nov. 29, 1962, Ser. No. 241,005
11 Claims. (Cl. 338—32)

The present invention relates to superconductive circuits and more particularly to improved superconducting gating devices of the thin film type which incorporate two shield planes, and circuits using these devices.

Known superconductive gating devices include the wire wound cryotron, the crossed thin film cryotron, and the in-line cryotron.

The term "cryotron," as used in the present specification, refers to cryogenic gating devices composed of materials which are said to be normally superconductive when maintained at very low temperatures such as may be achieved by immersion in liquid helium, for example. These cryotron gating devices include a main or gate conductor fabricated of a soft superconductive material, such as tantalum or tin, and one or more control conductors fabricated of a hard superconductive material, such as niobium or lead. The control conductor is energized to drive the gate conductor from a superconducting to a resistive state while the control conductor remains in the superconducting state. While reference is made here to the switching of a soft superconductive gate conductor section to a resistive state, it will be understood that this material continues to be an electrical conductor in the usual sense of the term. Thus, the device is actually switched from a superconductive state to a normally conductive state in which it has the resistance which a conductor composed of this material would be expected to have above the superconductive temperature. The gate conductor of the wire wound cryotron is in the form of a wire, which may be hollow, and the control conductor in the form of a coil which is wound around the gate conductor wire. This type of device exhibits a relatively high inductance and low resistance and, therefore, a long time constant. Further, it is not susceptible to mass fabrication techniques. The crossed thin film cryotron includes planar thin film control and gate conductors with the control conductor being arranged at right angles to the gate conductor. Each of these conductors has a width appreciably greater than its thickness, and usually the width of the control conductor is made less than the width of the gate conductor to achieve current gain greater than unity. This device exhibits a lower inductance and a higher resistance than the wire wound device but is still somewhat limited in the resistance that can be achieved since only the length of the gate conductor which is actually traversed by the control conductor is driven into a resistive state. Attempts to increase the resistance of crossed thin film cryotrons by decreasing the thickness of the gate conductor have met wtih some success but the advantages realized are limited by the fact that, as the gate conductor thickness approaches a penetration depth, it becomes more and more difficult to achieve operating gain. The inductive characteristics of both the wire wound cryotron and crossed film cryotron are improved by the use of superconductive shields. The same is true of in-line cryotrons, in which the gate conductor and the control conductor are also planar thin films which are laid down one above the other on a superconductive shield and extend parallel to each other. With this type of construction, it has been possible to achieve relatively high resistances without using extremely thin gate conductors.

Further, by the use of control and gate conductors of equal width and using either a bias current applied to the control conductor or a separate biasing control conductor, operating gain greater than unity has been achieved.

The following patents, publications, and copending applications, exemplify the present state of the art.

U.S. Patent No. 2,832,897, issued April 29, 1958 to D. A. Buck;

U.S. Patent No. 2,966,598, issued December 27, 1960 to J. B. Mackay;

"Thin Film Catalog Memory" by A. E. Slade et al., Office of Naval Research Symposium Report, ACR–50, pp. 213–229.

And the following copending United States patent applications, each of which is assigned to the same assignee as the present application:

Application Serial No. 625,512 entitled "Fast Cryotrons," filed by R. L. Garwin on November 30, 1956.

Application Serial No. 761,085 entitled "Cryogenic Switching Devices," filed by R. L. Garwin on September 15, 1958.

Application Serial No. 809,818 entitled "Superconductor Guard Strip Gating Device," filed by J. J. Lentz et al. on April 29, 1959 and now Patent No. 3,138,784, issued June 23, 1964.

Application Serial No. 133,528 entitled "Superconductive In-Line Gating Devices and Circuits" filed by N. Meyers and C. Bertuch on August 23, 1961 and now Patent No. 3,145,310 issued August 18, 1964.

One object of the present invention is to provide an improved thin film in-line cryotron structure and improved circuits employing such structures.

Another object of the present invention is to provide improved in-line thin film cryotrons with enhanced switching speeds.

Prior in-line cryotrons have employed a structure having only one superconductive shield plane. It has been postulated in the past that no current gain could be obtained with a structure having two superconductive shield planes at the outer portions thereof. In fulfillment of one object of the present invention, however, it has been discovered that gain can be obtained in a cryotron device with double superconductive shields. This is a very important discovery because it makes feasible multiple layer cryogenic system structures in which adjacent layers are separated by shield members.

Another long-standing problem in the design of cryotrons and cryogenic circuits has involved the fact that mutual inductance effects between the control member and the gate member have seriously limited the speed of operation of the cryotron gating device. This problem has been particularly severe with the so-called "in-line" cryotrons. This is because the increase in current in the control conductor is resisted by the existence of the field created by the gate conductor current to be switched. The phenomenon is sometimes referred to below as "degenerative inductive coupling." For this reason, various efforts have been made to improve the switching speeds of cryotron devices by somehow reducing the net mutual inductance between gate and control conductors. One method advanced for obtaining this result is by providing a second gate current carrying conductor and a second control conductor with opposite current relationships to balance or counteract the mutual inductance between the main cryotron gate and the associated control conductor. Such a system is illustrated for instance in the above mentioned copending patent application Serial No. 133,528 filed by N. Meyers and C. Bertuch.

Another object of the present invention is to provide an improved and simplified double gate conductor cryotron structure which has no net degenerative inductive coupling.

In prior cryotron design efforts, it has been assumed that all inductive coupling between control and gate members is degenerative in nature; that is, that the inductive coupling is such as to decrease the switching speed. In prior cryotron structures which were capable of providing current gain, this proposition has generally been true.

However, in fulfillment of one of the objects of the present invention, it has been discovered that it is possible to provide an improved cryotron device displaying current gain and having a net inductive coupling between the control and gate members which actually enhances the switching speed of the device. This inductive coupling which enhances switching speeds is referred to herein as "regenerative inductive coupling."

Accordingly, it may be stated that another object of the present invention is to provide an improved cryotron device having no degenerative inductive coupling and providing for regenerative inductive coupling.

In carrying out the invention in one preferred embodiment thereof, there is provided a superconductive thin film control current carrying conductor arranged between parallel superconductive shield conductors. A gate conductor is positioned in proximity to one of the other conductors to define a region there-between of magnetic saturation for the magnetic field due to the current in the gate conductor, the current gain of the device being a function of the ratio of the spacing between two of said conductors to the thickness of said magnetic saturation region.

For a complete understanding of the invention, reference should be made to the following specification and the accompanying drawings which are as follows:

FIG. 1 is a cross-sectional end view of a cryotron gate structure in accordance with one embodiment of the present invention.

FIG. 1*a* is a perspective view of the embodiment of FIG. 1.

FIG. 1*b* is a diagram showing the characteristic curve of superconductivity threshold current values for the embodiment of FIG. 1.

Figure 4:
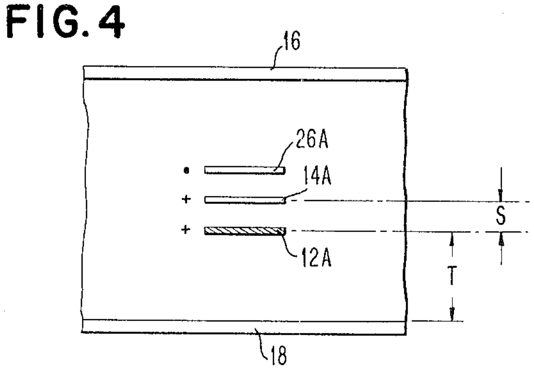
FIG. 4 is a cross-sectional end view of a modification of the embodiment of FIG. 3 in which the control current conductor section is adapted to carry the gate current in the opposite direction.
Figure 4A:
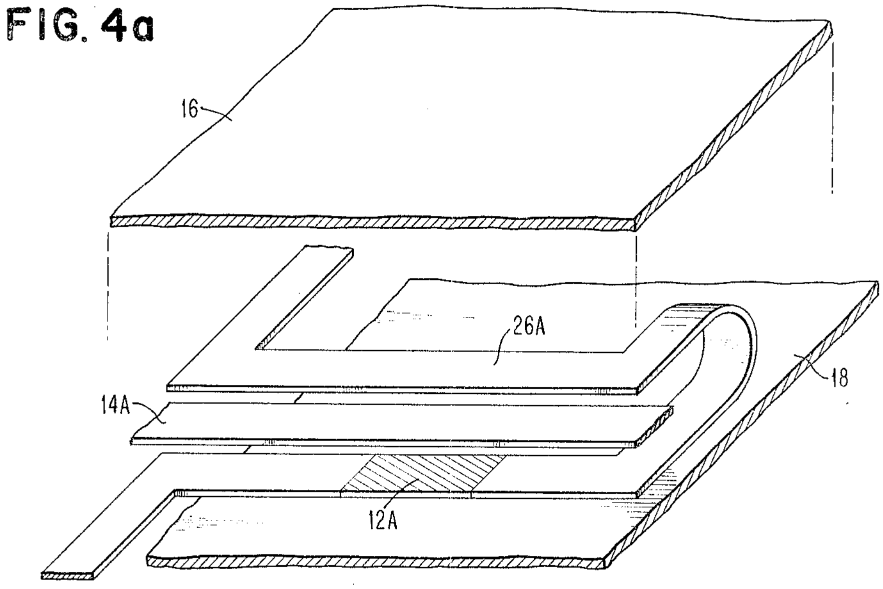

FIG. 4*a* is a perspective view illustrating the structure which may be employed in the embodiment of FIG. 4.

Figure 4B:
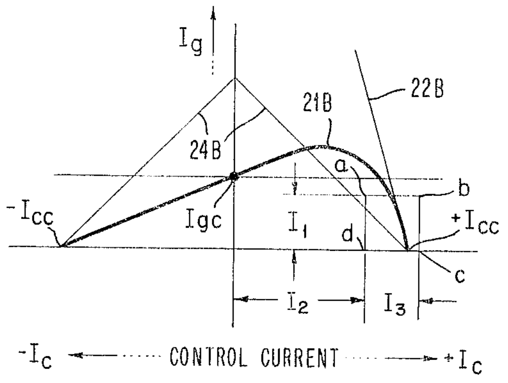

FIG. 4*b* is a diagram showing the characteristic curve of superconductivity threshold current values for the embodiment of FIG. 4.

Figure 5:
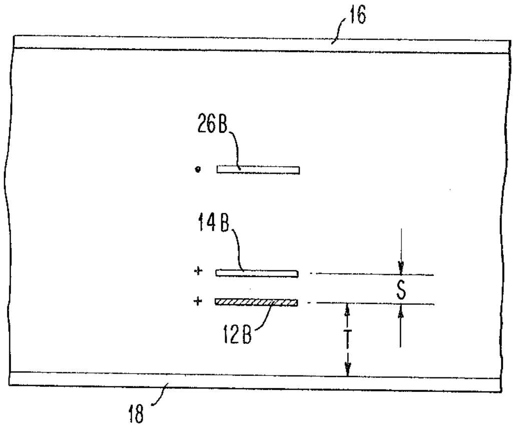

FIG. 5 is a cross-sectional end view of a modification of the embodiment of FIG. 4 in which the various conductors are unsymmetrically spaced to obtain regenerative coupling.

Figure 6:
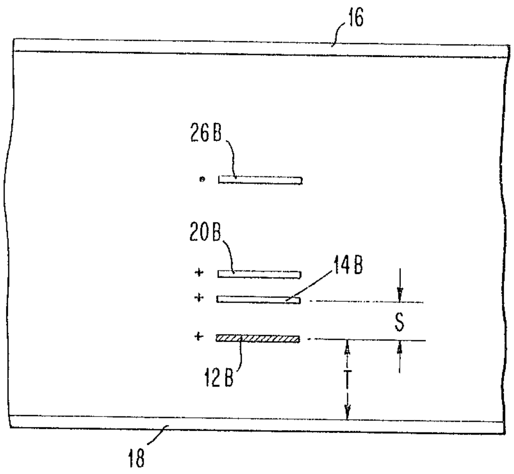

And FIG. 6 is a cross-sectional end view of a modification of the embodiment of FIG. 5 in which a bias control conductor is added.

Figure 1:
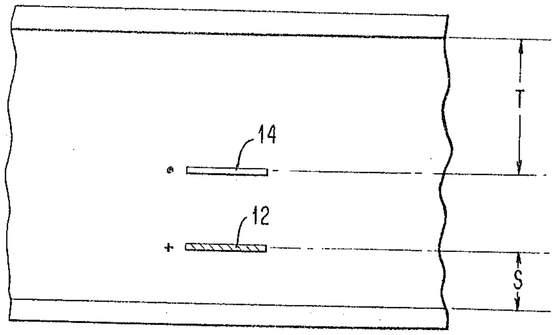
Figure 1A:
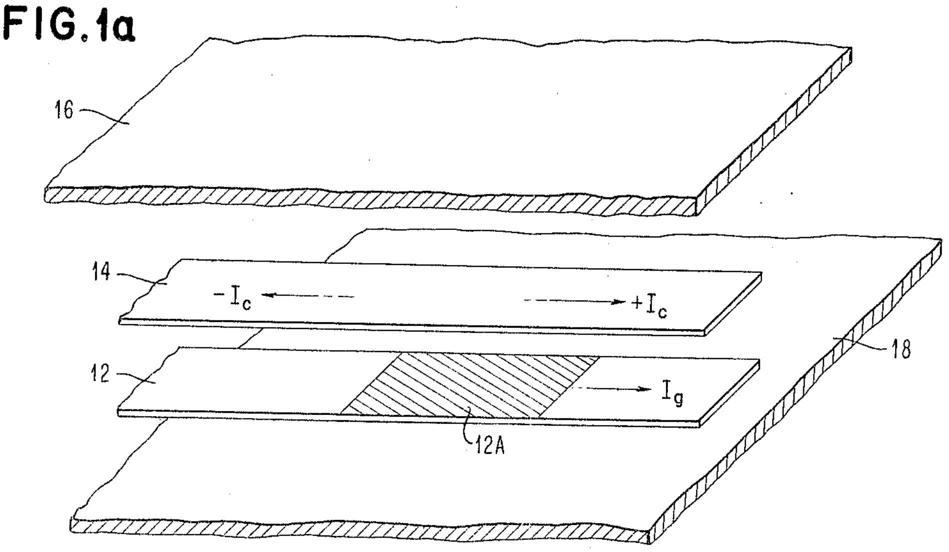

Referring now to the drawings in detail, FIG. 1 shows an in-line cryotron in accordance with the present invention. This cryotron includes a gate conductor strip 12, which includes a gate section 12A (shown in FIG. 1*a*), and a control conductor strip 14. The gate and control conductor strips are laid down one above the other in parallel spaced relationship between superconductive shields 16 and 18. The conductors and the shield are insulated from each other by appropriate layers of insulating material not shown in the drawing. The gate section 12A is fabricated of a soft superconductive material, such as tin or indium, and the remaining portions of strip 12, as well as the control conductor 14 and the shields 16 and 18, are fabricated of a hard superconductive material such as lead.

In operating the in-line cryotron of FIG. 1, the gate section 12A is in a superconducting state in the absence of current signals in the control conductor 14. Signals are applied to the control conductor 14 to produce a magnetic field of sufficient intensity to drive the soft superconducting gate section 12A into a resistive state. The resistance thus introduced into the gate strip 12 may be used to provide a voltage indication, or to switch a current flowing in the gate strip into a superconducting path connected in parallel with this strip.

Each of the strips 12 and 14 is fabricated to have a width very much greater than its thickness. Thickness dimensions are in the order of 10,000 angstroms or less and, as will be explained in some detail later, it is preferable that the thickness of the gate be appreciably greater than the electric current penetration depth of the superconductive gate material at the operating temperature of the device. With this type construction, that is with thin planar gate and control conductors and thin layers of insulating material separating these conductors, the operation of the device is essentially the same for signals applied to a single control conductor, or to two control conductors such as 14 which may be arranged one above the other. Such a modification is illustrated in FIG. 2 with an added control conductor 20. Thus, in considering the characteristics of the devices which are about to be explained with reference to FIG. 1*b*, it should be remembered that the control conductor current as plotted in these figures may be indicative of the current applied to a single control conductor in a device including only one such control conductor (as 14 in FIG. 1), or may represent the net control current in an in-line cryotron having multiple control conductors (as 14 and 20 in FIG. 2).

Figure 1B:
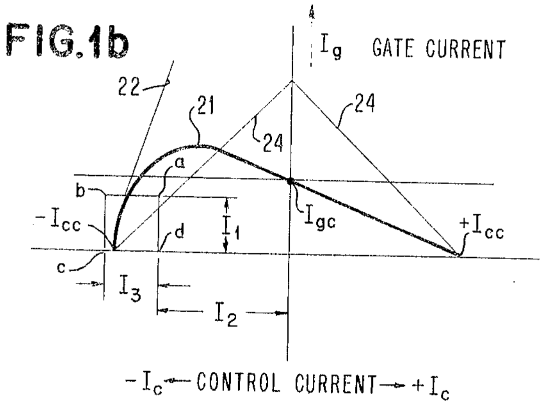
Figure 2:
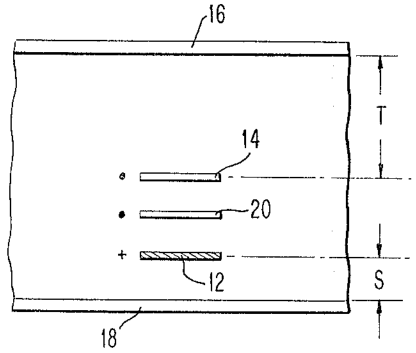
FIG. 2 is a cross-sectional end view of a modification of the embodiment of FIG. 1 in which a bias current control conductor has been added.

FIG. 1*b* shows the transition or gain characteristic 21 for the gate conductor section 12A of the device of FIG. 1. Gate conductor current $I_g$ is plotted as the ordinate in this figure and net control conductor current $I_c$ as the abscissa. For values of gate and control current defining loci beneath the curve, the gate section 12A is superconducting, and for values of gate and control conductor current defining loci above the curve, the gate section is resistive. The curve is plotted for gate conductor current $I_g$ in one direction, as indicated in FIG. 1, and control conductor current $I_c$ either in the same direction, and plotted as positive in FIG. 1*b*, or in an opposite direction in which case it is considered to be negative in the showing of FIG. 1*b*. The operation of these devices will be referred to as being parallel or anti-parallel, the term parallel indicating that the control and gate conductor currents are applied in the same direction, and the term anti-parallel indicating that the control and gate conductor currents are applied in opposite directions. As evidenced in FIG. 1*b*, the response of the device of FIG. 1 for applied currents in the same direction is significantly different than for applied currents in opposite directions. The value $I_{gc}$ in FIG. 1*b* represents the value of gate conductor current which is effective, in the absence of any current $I_c$ in the control conductor, to cause the gate conductor to assume a resistive state. The values $+I_{cc}$ and $-I_{cc}$ represent the critical current required in the control conductor to drive the gate resistive in the absence of gate conductor current. As can be seen for the curve 21, the critical current which the gate conductor can carry and remain superconducting is actually raised by applying control conductor current in the opposite direction, that is, where the device is operated in the anti-parallel mode as mentioned above. When the applied control current is in the same direction as the gate current, the amount of current which the gate can carry and remain superconducting is, as indicated by the curve, appreciably reduced.

The characteristic curve such as shown in FIG. 1*b* is similar to the characteristic curve which has been previously obtained with in-line thin film cryotrons. However, it has been assumed in prior thin film cryotron designs that a second shield conductor such as shield 16 is not present and in fact cannot be employed without destroying the possibility for current gain. However, it is one of the important discoveries of the present invention that a second shield conductor such as 16 may be added without destroying the current gain of the device. In order to accomplish this, the spacing dimension "S' from the gate conductor section 12 to the shield conductor 18 must be less than the spacing dimension "T" between the control conductor 14 and the shield conductor 16. It has been discovered that the potential current gain achievable by the device is generally equal to the ratio of "T" to "S." If the values of these spacings are changed, as the ratio of "T" to "S' decreases, the characteristic curve 21 is generally reduced in height as well as achieving a more symmetrical shape about the origin of the curve co-ordinates. The characteristic curve 21 as shown in FIG. 1*b* represents the characteristic achievable with a high value in the ratio of "T" to "S." The space indicated by the dimension "S" between the gate conductor section 12 and the shield 18 is a region of high magnetic field strength due to the current through the gate section 12. This high field strength exists in the absence of the existence of any control current, and it is referred to hereinafter as a condition of magnetic saturation. This terminology is not intended to imply that magnetically saturable material occupies this space beneath the gate conductor section, but that the space is so restricted in dimension with respect to the remaining space surrounding the gate conductor that a much higher degree of magnetic flux per unit of cross-sectional area exists in this space.

FIG. 1*b* illustrates the operation of the form of the invention shown in FIG. 2 as well as that of FIG. 1. The following description, which refers to the operation of FIG. 2, imparts added meaning to the characteristic curve of FIG. 1*b*. A bias current is continuously applied to the bias control conductor 20, and control current signals are applied to conductor 14 to control the gate section between superconducting and resistive states. In larger circuits, the gate conductor is connected in series with the control conductor of a second device of the same type. For this mode of operation, it is necessary that the device exhibit gain, that is, that the signal which is required to be applied to the signal control conductor to cause the gate conductor to be driven resistive be less than the current which the gate conductor can carry and still remain in a superconducting state. Referring to FIG. 2, a current in the negative direction equivalent to the value $I_2$ shown in FIG. 1*b* is applied as the bias current to the conductor 20. This is indicated by the dot sign shown to the left of conductor 20 in FIG. 2. At the same time, a gate current, in the positive direction as indicated by the + sign in FIG. 2 and having a magnitude $I_1$ shown in FIG. 1*b*, is applied to the gate conductor. With these currents being applied to the bias control conductor and gate conductor, the operating point is at point *a* in FIG. 1*b*. This point *a* is between two dotted slope lines designated 22 and 24. Line 22 represents the slope of the extreme left-hand portion of operating cahracteristic 21, and line 24 is a 45° line having a slope of 1. In order to achieve operating gain, it is necessary that the slope of the left-hand portion of curve 21, as represented by the line 22, the greater than unity and that the operating point *a*, with bias and gate current applied, be to the left of line 24 which has a slope of 1.

When it is desired to drive the gate conductor section 12A of FIG. 2 into a resistive state, a signal equal in magnitude to the current $I_3$ shown in FIG. 1*b* is applied to the signal control conductor 14. With this signal applied, the operating point is at point *b* and the soft superconductor section of gate conductor 12 is resistive. If the gate conductor strip is connected in parallel with a further superconducting strip and the current $I_1$ is then transferred out of strip 12, the operating point is at point *c* in which case the gate remains resistive. After the current shifting has been accomplished, the signal $I_3$ applied to signal control conductor 12 is removed, and the gate reassumes a superconducting state at point *d* with no current flowing into the gate conductor section. The device reassumes its initial state at point *a* when the current $I_1$ is switched back into the gate conductor strip 12. The operation depicted by the square *abcd* is for the case where the control and gate conductors of different in-line cryotrons are connected in series with each other with one such device driving the other. In such a case, the control conductor current for one device is equal to the gate conductor current for another device and thus the currents $I_1$ and $I_3$ may be equal. The actual operating gain in such a circuit is unity but, as is evident, in the showing of FIG. 1*b*, it is possible to drive the gate conductor section 12 from a superconducting to a resistive state with an applied signal having a magnitude less than $I_3$, in which case an operating gain greater than unity is achieved.

It is, of course, not always necessary to achieve operating gain greater than unity and other modes of operation of inline cryotrons may be realized using, for example, a single control conductor (as illustrated in FIG. 1) which is energized with a sufficiently large current signal to drive the gate conductor resistive. The signal applied to the control conductor is then greater than the current carried by the gate conductor. Of course part of the control signal may be considered as bias.

Where gain is realized, it is only realized as the result of the utilization of a bias current in conjunction with the control signals. This is only possible for a device exhibiting an operating characteristic with a slope greater than unity as indicated in FIG. 1*b*. For this to be achieved, it is necessary that the thickness of the soft superconductor gate section 12A of the in-line cryotron be greater than the current penetration depth of the material of which it is constructed at the operating temperaure.

Figure 3:
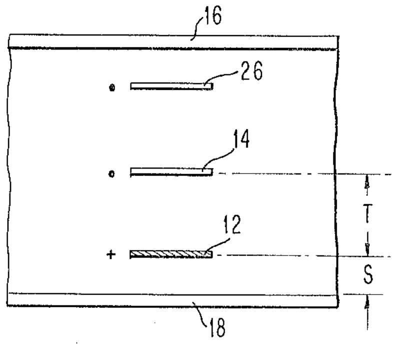
FIG. 3 is a cross-sectional end view illustrating a modified embodiment of the invention employing a single control conductor section and two gate current conductor sections disposed on opposite sides of the control current conductor section.

FIG. 3 illustrates another embodiment of the invention in which an additional gate current conductor 26 is provided which is connected and arranged to carry the same current carried by the gate conductor section 12, but in the opposite direction as signified by the dot sign shown to the left of this conductor in FIG. 3. In this modification, the structure is symmetrical with respect to the control conductor section 14. Thus, gate conductor sections 12 and 26 are equally spaced on opposite sides of the control conductor 14 and the shield conductors 16 and 18 are equally spaced respectively beyond the gate conductors 26 and 12. In this embodiment, the magnetic saturation again occurs between gate 12 and shield 18 in the dimension identified as "S." The other critical dimension "T" is the spacing between the gate conductor 12 and control conductor 14. Because the bucking gate section 26 and the switchable gate section 12 carry the gate current in opposite directions, the magnetic coupling of each of these sections to the control conductor section 14 is equal and opposite. Therefore, the net mutual inductive coupling, as seen by the control circuit which supplies current to control conductor section 14 is essentially zero. Thus, the degenerative inductive coupling is substantially eliminated. This makes the device of FIG. 3 substantially faster in switching speed than the devices of FIGS. 1 and 2. This is true because the inductive coupling of the gate current carrying conductors with the control conductor does not inhibit or resist the initiation of current in the control conductor 14. The operating characteristic curve for superconductivity in the gate section 12 of FIG. 3 is substantially the same as that for FIGS. 1 and 2 as illustrated by FIG. 1*b*.

FIG. 4 illustrates a modification of the invention which includes a bucking gate current carrying section 26A. It is similar to the embodiment of FIG. 3, except that the vertical spacing of the conductors is different, and the control conductor 14A is adapted to carry a control current which is in the same direction as the current in the gate conductor section 12A. This is indicated in the drawing by the plus signs to the left of each of these conductors. In this embodiment, the magnetic saturation space is between the gate section 12A and the control conductor section 14A as indicated by the dimension "S." The other critical dimension "T" is between the gate conductor section 12A and the shield conductor 18. Again the gain possible with the structure may be signified by the ratio of T to S.

FIG. 4*a* is a perspective view illustrating how structures such as that in FIG. 4 and FIG. 3 may be carried out. In FIG. 4*a* the upper shield conductor 16 has been moved upwardly to expose the arrangement of the other conductors. The other conductor spacings in FIG. 4*a* are not necessarily to scale because the drawing is more clearly presented without such scale.

FIG. 4*b* illustrates the superconductivity characteristic curve 21B for the embodiment of FIG. 4. A very interesting feature of the embodiment of FIG. 4 is that this superconductivity characteristic curve is basically a mirror image of the characteristic curve 21 of FIG. 1*b*. In FIG. 4*b* the maximum gain slope line is identified as 22B and the unity gain slope line as 24B. All of the remaining parts of FIG. 4*b* are labelled similarly to the corresponding parts of FIG. 1*b*. In FIG. 4*b* the maximum gain portion of the characteristic 21B appears in the positive quadrant where both the gate and control currents are in a positive direction. This is very interesting because in prior in-line cryotron structures generally it has been postulated that the maximum gain portion of an asymmetrical superconductivity curve appears in the negative control current quadrant as shown in FIG. 1*b*. Despite the difference in the control and gate current relationships between FIGS. 3 and 4, the speed and gain of the embodiments of FIGS. 3 and 4 are approximately the same when the ratio of "T" to "S" are the same. However, the efficiency of the embodiment of FIG. 4 is somewhat better because of the closer coupling between the control and gate conductor sections 14A and 12A which is inherent in the FIG. 4 structure. This is due to the requirement that the magnetic saturation space "S" of restricted dimension appears between the gate 12A and control conductor 14A sections.

It has been discovered that the embodiment of FIG. 4 may be modified as shown in FIG. 5 to obtain a net mutual inductive coupling between the control conductor and the gate current carrying conductors which is regenerative in nature. That is, the inductive coupling of the gate current conductors with the control current conductor is such as to promote the initiation of the control current which will switch the cryotron gate section resistive. This modification to obtain regenerative coupling is accomplished by moving the control conductor section 14B off center so that it is closer to the gate conductor section 12B than it is to the bucking gate conductor section 26B. This provides a coupling from gate conductor 12B to control conductor 14B which is greater than the coupling from the bucking conductor 26B to the control conductor 14B. It is also preferred to increase the spacing between bucking conductor 26B and the shield conductor 16 in the embodiment of FIG. 5. As in all of the other embodiments, the gain again may be represented by the ratio "T" to "S" and these critical dimensions appear in the same portions of the structure as in the embodiment of FIG. 4.

FIG. 6 is a modification of the embodiment of FIG. 5 in which a bias conductor 20B is added. As explained in connection with the structure of FIG. 2, the bias conductor is simply an additional control conductor which provides the advantage of a separate electrical circuit for the bias control signal. In other respects, the embodiment of FIG. 6 is substantially the same as the embodiment of FIG. 5.

The embodiments of FIGS. 5 and 6 both have superconductor operating characteristics substantially as shown in FIG. 4*b*. This characteristic, in which the maximum gain is achieved in the positive control current quadrant, is essential to the principle of the regenerative conductive coupling.

It is apparent that the above described embodiments of the invention fulfill all of the objects and advantages sought by the invention and listed at the beginning of this specification. The regenerative inductive coupling is believed to be particularly unusual and unexpected in view of the prior belief that mutual inductive coupling must be minimized because it is always degenerative in nature.

What is claimed is:

1. A double shielded thin film cryogenic gating device comprising:
- (a) a hard superconductor thin film control conductor,
- (b) two hard superconductor shield conductors arranged on opposite sides of said control conductor and parallel thereto,
- (c) a soft superconductor film gate conductor positioned parallel to and between said control conductor and one of said shield conductors, and having a thickness greater than its current penetration depth at its operating temperature the widths of the gate and control conductors being very much greater than their respective thicknesses, means for providing insulated spacings between all said conductors,
- (d) the insulated space between said gate conductor and the nearest one of said other conductors being less than one of the other inter-conductor spaces.

2. A double shielded cryogenic gating device comprising:
- (a) two spaced parallel shield conductors,
- (b) at least the inner surfaces of said conductors being composed of a hard superconductor material,
- (c) a control conductor composed of a hard superconductor film centrally arranged between said shield conductors and parallel thereto,
- (d) at least one gate conductor section arranged adjacent to said control conductor section within the space defined by said shield conductors and parallel thereto, the widths of the gate and control conductors being very much greater than their respective thicknesses, means for providing insulated spacings between all said conductors,
- (e) said gate conductor section being composed of a soft superconductor material for switching to a resistive state in response to current in said control conductor and having a thickness greater than its current penetration depth at its operating temperature,
- (f) the insulated space between said soft superconductor gate section and the nearest one of the conductors adjacent thereto being greater than the insulated space from said soft superconductor section to the other conductor adjacent thereto.

3. A double shielded thin film cryogenic gating device comprising:
- (a) a pair of parallel superconductive shield conductors, a superconductive thin film control current carrying conductor arranged between and parallel to said shield conductors,
- (b) a gate conductor positioned between and parallel to said control conductor and one of said shield conductors and positioned in proximity to one of said conductors, said gate conductor having a thickness greater than the current penetration depth of the gate material at its operating temperature, the widths of the gate and control conductors being very much greater than their respective thicknesses, means for providing insulated regions between all of said conductors, (c) the region between said gate conductor and said proximate conductor being a region of magnetic saturation for the magnetic field due to the current in the gate conductor.

4. An in-line cryogenic gating device comprising a single gate conductor section composed of a soft superconductive film, the latter having a thickness greater than its current penetration depth at its operating temperature, (a) at least one control conductor having a section arranged in spaced parallel relationship to said gate conductor section and being composed of a hard superconductive film, (b) two shield conductors arranged parallel to said gate and control conductor sections on opposite sides thereof to define a space within which said control and gate conductor sections are contained, the widths of the gate and control conductors being very much greater than their respective thicknesses, means for providing insulated spacings between all said conductors, (1) said shield conductor being composed of hard superconductive material, (c) the insulated space between said control conductor section and a first shield conductor adjacent thereto being greater than the shield space between said gate conductor section and the second shield conductor adjacent thereto.

5. An in-line cryogenic gating device comprising:

(a) single gate conductor section composed of a soft superconductive film, the latter having a thickness greater than its current penetration depth at its operating temperature, (b) at least one control conductor having a section arranged in spaced parallel relationship to said gate conductor section and being composed of a hard superconductive film, (c) two shield conductors arranged parallel to said gate and control conductor sections on opposite sides thereof to define a space within which said control and gate conductor sections are contained, (1) said shield conductors being composed of hard superconductive material, the widths of the gate and control conductors being very much greater than their respective thicknesses, means for providing insulated spacings between all said conductors, (d) the insulated space between said control conductor section and a first shield conductor adjacent thereto being greater than the insulated space between said gate conductor section and the second shield conductor adjacent thereto, (1) said last-mentioned space being constricted to provide for magnetic saturation in response to the gate current.

(e) and a bias control conductor arranged between and insulated from said gate and control conductors and parallel thereto and arranged to carry a bias current in a direction anti-parallel to the current in said gate conductor.

6. A double shielded cryogenic gating device comprising:

(a) two spaced parallel shield conductors, (1) at least the inner surfaces of said conductors being composed of a hard superconductor material, (b) a control conductor section composed of a hard superconductor film centrally arranged between said shield conductors and parallel thereto, (c) two gate conductor sections arranged on opposite sides of said control conductor section within the space defined by said shield conductors and parallel thereto, the widths of the gate and control conductors being very much greater than their respective thicknesses, means for providing insulated spacings between all said conductors, (1) said gate conductor sections being connected to conduct the current to be gated respectively in parallel and anti-parallel directions with respect to the current in said control conductor, (2) at least one of said gate current conductor sections being composed of a soft superconductor material for switching to a resistive state in response to current in said control conductor, and having a thickness greater than its current penetration depth at its operating temperature, (d) the insulated space between said soft superconductor gate section and the nearest one of the conductors adjacent thereto being greater than the insulated space between said soft superconductor gate section and the other conductor adjacent thereto.

7. A cryotron gating device comprising:

(a) two spaced parallel plane shield conductors composed of a hard superconductor material, (b) a control conductor composed of a hard superconductor film arranged midway between said shield planes and parallel thereto, (c) two gate conductor film sections symmetrically arranged on opposite sides of said control conductor within the space defined by said shield conductors and parallel thereto, the widths of the gate and control conductors being very much greater than their respective thicknesses, means for providing insulated spacings between all said conductors, (1) said gate conductor sections being connected to conduct the current to be gated respectively in parallel and anti-parallel directions with respect to the current in said control conductor, (2) at least one of said gate current conductor sections being composed of a soft superconductor material for switching to a resistive state in response to current in said control conductor and having a thickness greater than its current penetration depth at its operating temperature, (d) the insulated space between said soft superconductor gate section and the nearest one of the conductors adjacent thereto being greater than the insulated space between said soft superconductor gate section and the other conductor adjacent thereto.

8. A cryotron gating device comprising:

(a) two spaced parallel plane shield conductors composed of a hard superconductor material, (b) a control conductor composed of a hard superconductor film arranged midway between said shield planes and parallel thereto, (c) two gate conductor film sections symmetrically arranged on opposite sides of said control conductor within the space defined by said shield conductors and parallel thereto, the widths of the gate and control conductors being very much greater than their respective thicknesses, means for providing insulated spacings between all said conductors, (d) said gate conductor sections being connected to conduct the current to be gated respectively in parallel and anti-parallel directions with respect to the current in said control conductor, (e) said gate current conductor section which is connected to conduct said current in said anti-parallel direction being composed of a soft superconductor material for switching to a resistive state in response to current in said control conductor and having a thickness greater than its current penetration depth at its operating temperature, (f) the insulated space between said soft superconductor gate section and the nearest shield plane adjacent thereto being less than the insulated space between said soft superconductor gate section and control conductor.

9. A cryotron gating device comprising:

(a) two spaced parallel plane shield conductors composed of a hard superconductor material, (b) a control conductor composed of a hard superconductor film arranged between said shield planes and parallel thereto, (c) two gate conductor film sections arranged on opposite sides of said control conductor within the space defined by said shield conductors and parallel thereto the widths of the gate and control conductors being very much greater than their respective thicknesses, means for providing insulated spacings between all said conductors, (d) said gate conductor sections being connected to conduct the current to be gated respectively in parallel and anti-parallel directions with respect to the current in said control conductor, (e) said gate current conductor section which is connected to conduct said current in said parallel direction being composed of a soft superconductor material for switching to a resistive state in response to current in said control conductor and having a thickness greater than its current penetration depth at its operating temperature, (f) the insulated space between said soft superconductor gate section and said control conductor being less than the insulated space between said soft superconductor gate section and the shield plane adjacent thereto.

10. A gating device comprising:

(a) two spaced parallel shield conductors, (1) at least the inner surface of said conductors being composed of a hard superconductor material, (b) a control conductor section composed of a hard superconductor film arranged between said shield conductors and parallel thereto, (c) two gate conductor sections arranged on opposite sides of said control conductor section within the space defined by said shield conductors and parallel thereto, the widths of the gate and control conductors being very much greater than their respective thicknesses, means for providing insulated spacings between all said conductors, (d) said gate conductor sections being connected to conduct the current to be gated respectively in parallel and anti-parallel directions with respect to said control conductor, (e) said gate current conductor section which is connected to conduct current in said parallel direction being composed of a soft superconductor material for switching to a resistive state in response to current in said control conductor and having a thickness greater than its current penetration depth at its operating temperature, (f) the insulated space between said soft superconductor gate section and the nearest shield conductor adjacent thereto being greater than the insulated space between said soft superconductor section and said control conductor, (g) and the insulated space between said anti-parallel gate conductor section and said control conductor being greater than said insulated space between said soft superconductor section and said control conductor to provide regenerative inductive coupling therebetween.

11. A thin film cryogenic gating device having regenerative inductive coupling comprising:

(a) two shield conductor planes having a hard superconductor surface, (b) a soft superconductor film gate conductor section positioned in spaced parallel relationship to said shield plane and arranged to carry a current to be gated, said soft superconductor film having a thickness greater than its current penetration depth at its operating temperature, (c) a hard superconductor film control conductor arranged parallel to said soft gate section and spaced more closely thereto than the spacing of said soft gate section to said shield plane, (d) said control conductor being arranged to conduct a control current in the same direction as the current to be gated in said gate section, (e) a bucking gate current carrying conductor section positioned in spaced parallel relationship to said control conductor on the side of said control conductor opposite to said soft gate conductor section and with a greater spacing therefrom the width of the gate and control conductors being very much greater than their respective thicknesses, means for providing insulated spacings between all said conductors, (1) said bucking conductor section being composed of a hard superconductor film, (f) and being connected with said soft superconductor gate section to conduct the current to be gated in a direction opposite to the direction of the current in said control conductor.

References Cited by the Examiner

UNITED STATES PATENTS

| | | | |
|---|---|---|---|
| 2,832,897 | 4/1958 | Buck | 307—88.5 |
| 2,966,598 | 12/1960 | Macay | 307—88.5 |
| 2,966,647 | 12/1960 | Lentz | 338—32 |
| 2,989,714 | 6/1961 | Park et al. | 338—32 |
| 3,059,196 | 10/1962 | Lentz | 338—32 |
| 3,145,310 | 8/1964 | Bertuch et al. | 307—88.5 |

RICHARD M. WOOD, *Primary Examiner.*

W. D. BROOKS, H. T. POWELL, *Assistant Examiners.*